(12) United States Patent
Tang et al.

(10) Patent No.: US 12,113,331 B2
(45) Date of Patent: *Oct. 8, 2024

(54) SYSTEM AND APPARATUS FOR SEQUENTIAL TRANSIENT LIQUID PHASE BONDING

(71) Applicant: Aeva, Inc., Mountain View, CA (US)

(72) Inventors: Zhizhong Tang, San Carlos, CA (US); Pradeep Srinivasan, Fremont, CA (US); Kevin Masuda, Alhambra, CA (US); Wenjing Liang, San Jose, CA (US)

(73) Assignee: Aeva, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,770

(22) Filed: Jun. 16, 2023

(65) Prior Publication Data
US 2023/0327395 A1 Oct. 12, 2023

Related U.S. Application Data

(63) Continuation of application No. 17/734,506, filed on May 2, 2022, now Pat. No. 11,715,929, which is a continuation of application No. 17/502,941, filed on Oct. 15, 2021, now Pat. No. 11,362,485.

(51) Int. Cl.
*H01S 5/0237* (2021.01)
*B23K 1/005* (2006.01)
*B23K 101/40* (2006.01)
*H01S 5/40* (2006.01)

(52) U.S. Cl.
CPC .......... *H01S 5/0237* (2021.01); *B23K 1/0056* (2013.01); *H01S 5/4025* (2013.01); *B23K 2101/40* (2018.08)

(58) Field of Classification Search
CPC ....................................... H01S 5/4025
See application file for complete search history.

(56) References Cited

U.S. PATENT DOCUMENTS

2014/0183758 A1* 7/2014 Nakamura ............... H01L 24/97
  438/109
2014/0312511 A1* 10/2014 Nakamura ............... H01L 24/81
  438/109

* cited by examiner

*Primary Examiner* — Tuan N Nguyen
(74) *Attorney, Agent, or Firm* — Kramer Levin Naftalis & Frankel LLP

(57) ABSTRACT

Embodiments of the present disclosure include method for sequentially mounting multiple semiconductor devices onto a substrate having a composite metal structure on both the semiconductor devices and the substrate for improved process tolerance and reduced device distances without thermal interference. The mounting process causes "selective" intermixing between the metal layers on the devices and the substrate and increases the melting point of the resulting alloy materials.

20 Claims, 20 Drawing Sheets

1000

- Load the mounting substrate having AuSn pads to bonding setup. Preheat the mounting substrate to a pre-determined temperature according to a first predetermined set point — 1001

- Fetch a laser coated with sufficient Au, by the pickup head of bonding setup — 1002

- Align the laser respect to the mounting substrate according to the design location — 1003

- Lower the laser until touching the mounting substrate — 1004

- Turn on the heater to increase the laser temperature according to a second predetermined temperature set point — 1005

- Keep the laser at the peak temperature for a pre-determined time duration and cause intermixing of metals between the AuSn pad of the substrate and the Au layer of the laser — 1006

- Turn off the heater and let the laser cool down — 1007

1008 Is this the last laser? — No (return to 1002) / Yes

- Remove the mounting substrate from bonding setup — 1009 → Stop

- Load a substrate with AuSn alloy pads at the designed locations to bonding setup.
- Prepare semiconductor chips with Au layers on top

— 1101

- Attach a first semiconductor chip to a first receiving pad of the platform

— 1102

- Raise the temperature of the first semiconductor chip according to a set of predetermined temperature set points and time durations and cause intermixing of the An layer of the semiconductor chip and the AuSn pad of the substrate

— 1103

- Attach a next semiconductor chip to next receiving pad of the platform

— 1104

- Raise the temperature of the next semiconductor chip according to the same set of predetermined temperature set points and time durations and cause intermixing of the An layer of the semiconductor chip and the AuSn pad of the substrate

— 1105

1108 — Is this the last chip

No → (back to 1104)

Yes ↓

1109 — Remove the platform from bonding setup → Stop

SYSTEM AND APPARATUS FOR SEQUENTIAL TRANSIENT LIQUID PHASE BONDING

CROSS-REFERENCE TO RELATED APPLICATIONS

This application is a continuation of U.S. application Ser. No. 17/734,506, filed on May 2, 2022, which is a continuation of U.S. application Ser. No. 17/502,941, which issued on Jun. 14, 2022, as U.S. Pat. No. 11,362,485.

TECHNICAL FIELD

The present disclosure relates generally to methods to bond multiple semiconductor chips onto a common platform sequentially without impacting each other while minimizing the spacing between semiconductor chips by activating transient liquid phase bonding process only on the semiconductor chip under bonding.

BACKGROUND

Typically, conventional semiconductor packaging processes involving multiple semiconductor lasers require the lasers to be first mounted to an individual laser submount in order to provide mechanical support and electrical connection to the lasers after the submounts are integrated into an optical system. While this approach may offer some degree of flexibility, the minimal spacing between lasers employed by conventional techniques is often due to the physical constraints of submounts which are generally much larger than the lasers.

Alternatively, semiconductor laser bars having multiple laser stripes with precise spacing between laser stripes can be mounted to one submount first (FIG. 1) and the submount is, subsequently, integrated into an optical system. While this approach offers small spacing between laser strips, the spacing is fixed during the production of the laser bars. The changes of the spacing are inflexible.

The approach of mounting multiple semiconductor lasers onto one single submount is not widely used because a rather large spacing between lasers is needed to avoid thermal interference of sequential laser mounting processes. When mounting semiconductor lasers directly to a Photonic Integrated Circuit ("PIC") substrate (FIG. 2), such large distances between lasers impose a design constraint, causing inflexibility and increase in cost due to need of a PIC chip with a larger size. Thus, an approach to minimize the thermal interference between sequential mounting is highly desirable to reduce the cost and size of the overall optical system while not imposing additional design inflexibility or requiring expensive assembly setup.

BRIEF SUMMARY

The present disclosure describes a sequential laser mounting process onto a platform or substrate. With the design of metal combinations on both the lasers and the platform or substrate, the same mounting process can be repeated with reduced distance between lasers without the thermal interference caused by repeated mounting processes.

The key concept of the mounting process of the present invention described herein is "selectively" activating transient liquid phase bonding process. The purpose of transient liquid phase bonding is to increase the melting point of resulting metal alloy from an alloy provided by the platform or substrate where the lasers are to be mounted. The "selectivity" is enabled by the introduction of additional metal of a desired kind from the lasers which are to be bonded. The metal alloy section on the platform or substrate, previously processed or previously not processed, will not be affected by the temperature excursion required by the bonding process. Such "selectivity" improves the immunity from thermal interference, thus reducing the minimal spacing between lasers.

In one example, a method for performing sequential bonding, according to the present disclosure, comprises attaching a first laser coated with a gold layer of sufficient amount to a receiving AuSn pad of a substrate; bonding the first laser and causing intermixing of the gold layer on the first laser and the AuSn alloy pad; attaching a second laser coated with a gold layer of sufficient amount to another receiving AuSn pad of a substrate at the sufficient distance; bonding the second laser and causing intermixing of the gold layer on the second laser and the AuSn alloy pad and without causing melting of the intermixed alloy of the first laser; wherein the first bonding process and the second bonding process are generated by from a common set of temperature set points and time durations. The lasers can be made of GaAs, InP, or other semiconductor materials.

In one example, a method for performing sequential bonding, according to the present disclosure, comprises attaching a first semiconductor chip coated with a gold layer of sufficient amount to a receiving AuSn pad of a substrate; bonding the first semiconductor chip and causing intermixing of the gold layer of sufficient amount on the first semiconductor chip and the AuSn alloy pad; attaching a second semiconductor chip coated with a gold layer to another receiving AuSn pad of a substrate at the sufficient distance; bonding the second semiconductor chip and causing intermixing of the gold layer on the second semiconductor chip and the AuSn alloy pad and without causing melting of the intermixed alloy of the first semiconductor chip; wherein the first bonding process and the second bonding process are generated from a common set of temperature set points and time durations. The intermixing of the Au layers and the AuSn pads allows a shorter distance between the lasers than the case without intermixing. The semiconductor chips can be any of lasers, detectors, modulator, gain medium, filters, etc., and can be made of Si, GaAs, InP or other semiconductor materials.

In one example, a method for performing sequential bonding, according to the present disclosure, comprises attaching a first laser coated with a gold layer of sufficient amount to a receiving AuSn pad of a substrate; bonding the first laser and causing intermixing of the gold layer on the first laser and the AuSn alloy pad; attaching a second laser coated with a gold layer of sufficient amount to another receiving AuSn pad of a substrate at the sufficient distance during the bonding process of the first laser; when the bond process of the first laser is completed, bonding the second laser and causing intermixing of the gold layer on the second laser and the AuSn alloy pad and without causing melting of the intermixed alloy of the first laser; wherein the first bonding process and the second bonding process are from a common set of temperature set points and time durations. The intermixing of the Au layers and the AuSn pads allows a shorter distance between the lasers than the case without intermixing. The lasers can be made of GaAs, InP or other semiconductor materials.

These and other aspects of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and examples, should be viewed as combinable unless the context of the disclosure clearly dictates otherwise.

It will therefore be appreciated that this Summary is provided merely for purposes of summarizing some examples so as to provide a basic understanding of some aspects of the disclosure without limiting or narrowing the scope or spirit of the disclosure in any way. Other examples, aspects, and advantages will become apparent from the following detailed description taken in conjunction with the accompanying figures which illustrate the principles of the described examples.

BRIEF DESCRIPTION OF THE DRAWINGS

For a more complete understanding of various examples, reference is now made to the following detailed description taken in connection with the accompanying drawings in which like identifiers correspond to like elements:

FIG. 10 depicts a process flow of the bonding process for multiple-laser attachments, according to some embodiments of the present disclosure.

FIG. 11 depicts a process flow of the bonding process for multiple-semiconductor-chip attachments, according to some embodiments of the present disclosure.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Figure 1:
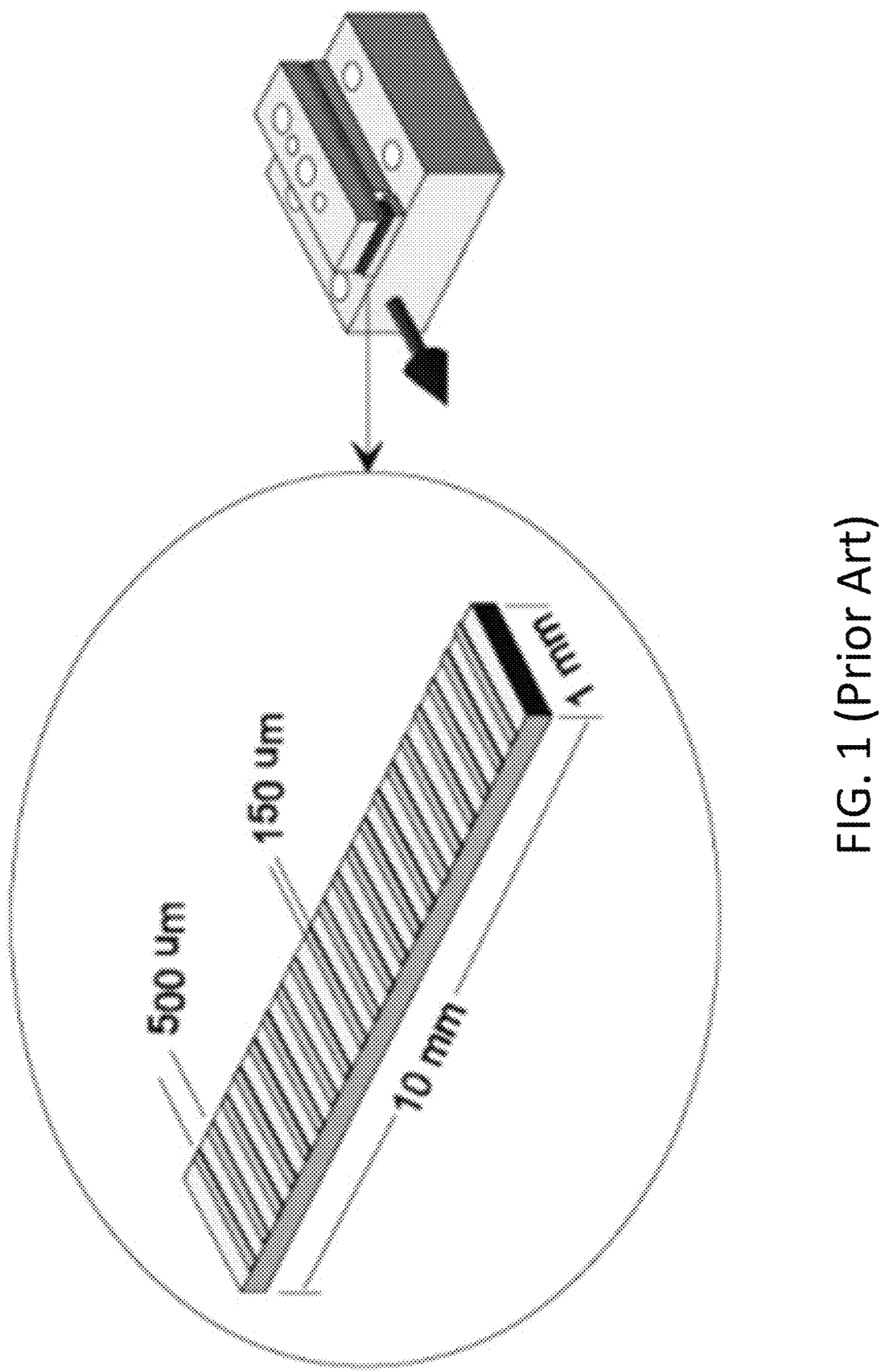
FIG. 1 shows a prior art semiconductor laser array where laser spacing is fixed after fabrication.

Without limiting the scope of the present invention, embodiments of the disclosure provide examples implemented FIG. 1 illustrates a conventional semiconductor laser bar on which many laser stripes are fabricated together. During the fabrication process, the top surface of a semiconductor is deposited with epitaxial layers to form the active region. To make the metal contacts, laser devices are processed by standard semiconductor processes including photolithographic patterning processes. As shown in FIG. 1, the top stripes are the contacts of the cathodes of the lasers and the bottom contact provides the anode contacts. Alternatively, both types of contacts are provided on the top surface. In most of the applications as shown in FIG. 1, these lasers are actually electrically tied together and are driven simultaneously. The purpose of having multiple laser stripes is to increase the light output.

Figure 2:
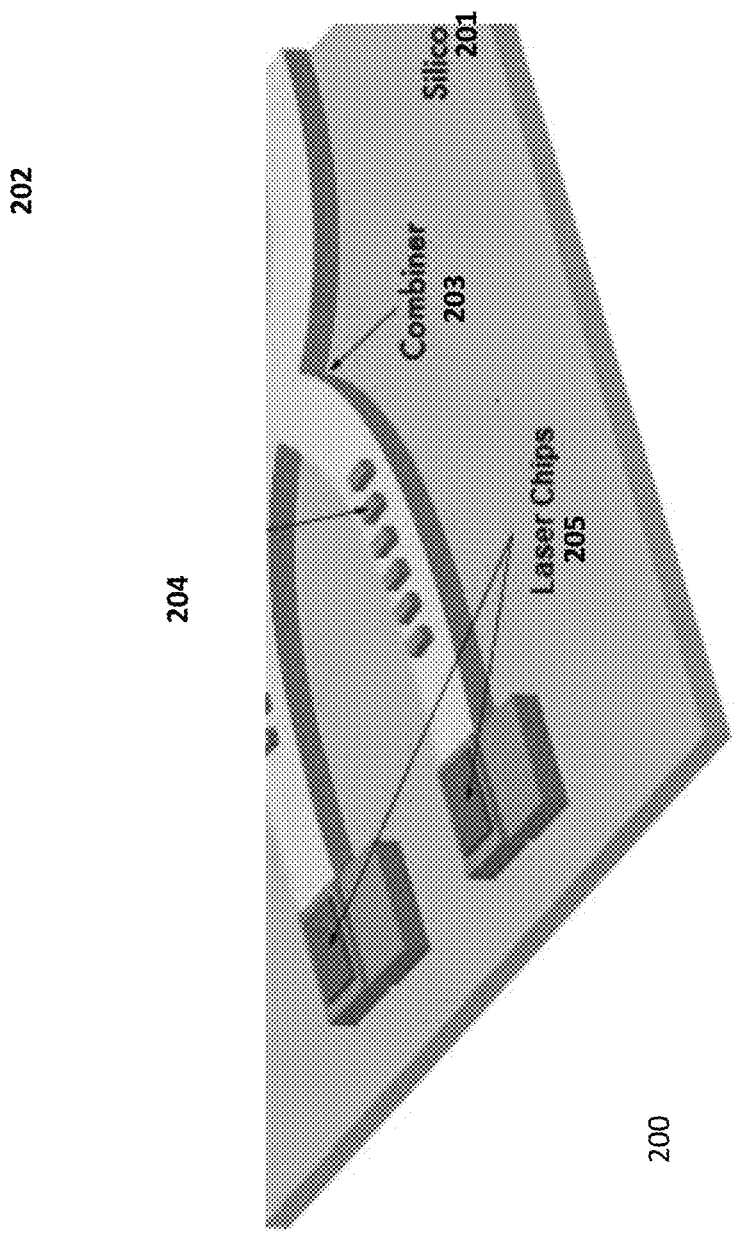
FIG. 2 illustrates a Photonic Integrated Circuit made on silicon chip having multiple active devices (lasers, gain chips, photodetectors, and the like) to be mounted at various locations, according to some embodiments.
Figure 3A:
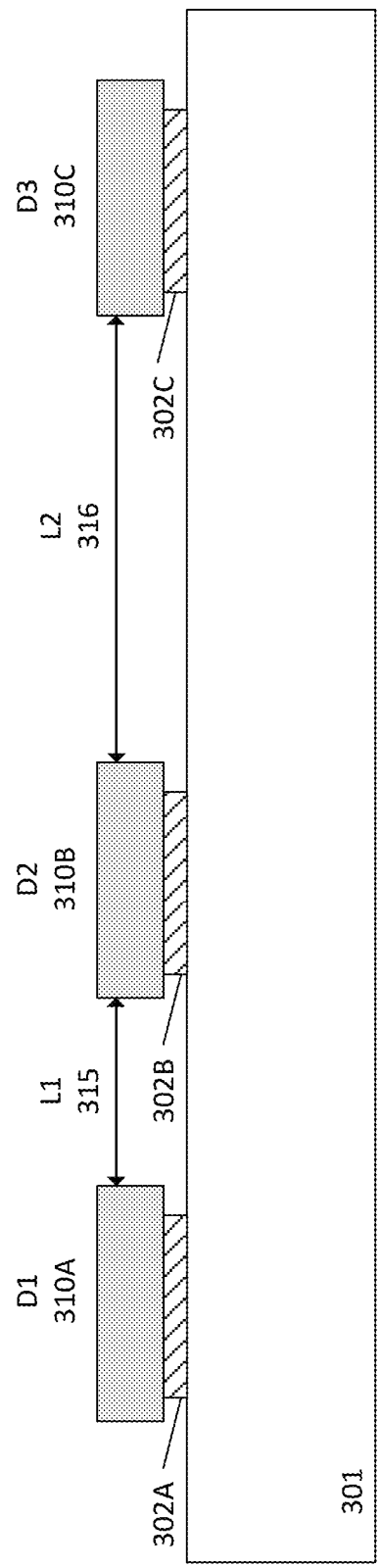
FIG. 3A shows a cross-section view of a mounting substrate on which multiple devices are sequentially mounted, according to some embodiments, where the distances between laser may vary.

FIG. 2 illustrates a different type of multiple laser system where individual semiconductor (gain or laser) chips are mounted at different locations, according to some embodiments of present disclosure. These locations are determined by the layout of photonic integrated circuit 202 fabricated on substrate 201. It should be appreciated that embodiments of the present disclosure are not limited to the photonic integrated circuit (PIC) shown in FIG. 2 which comprises narrowband tunable filters 204 and a combiner 203. According to some embodiments, more than two semiconductor lasers 205 along with more combiners 203 can be integrated onto the same substrate. It should be appreciated that the locations of the lasers illustrated in FIG. 2 can vary between combiners 203 or between different PIC designs as illustrated in FIG. 3A. In FIG. 3A, distance L1 315 between devices D1 310A and D2 310B can be different from distance L2 316 between devices D2 310B and D3 310C.

Further, the active devices 205 which can be integrated onto the PIC substrate 201 can be different. For example, they can be lasers with different wavelengths, lasers with different properties, LEDs, light modulators, photodetector, tunable filters, etc.

Mounting multiple semiconductor devices onto a PIC, while adding more functionalities, suffers some limitations. The relative position between the mounted device and the PIC has to be maintained with extremely high precision and high stability. Typically, the alignment tolerance is in the order of 1 μm or less. Once the device is mounted, it should not be allowed to shift in position during the downstream processes (assembly processes, testing processes, and the like) and during the operation. Such tight tolerance imposes stringent mount requirements to photonic devices. Typically, solder materials (310A-C as illustrated in FIG. 3A) are used to mount photonic devices for its mechanical stability over a long period of time (~20 years), good electrical and thermal conductivities, and an acceptable process temperature range (e.g. <500° C.). The process of solder mounting is mainly to raise the temperature of solder materials to above its melting point for a short time during which the semiconductor chip is attached to a submount or a substrate by an aligning fixture. However, for mounting optical components, the usage of flux to remove surface oxides of solder materials is generally prohibitive to avoid contaminations to the optical surfaces. Taking all these requirements into considerations, Gold-Tin (AuSn) alloy can be used for mounting individual semiconductor optical components and is, therefore without being limited to, used to illustrate the present invention described herein. Other solder material systems used for mounting semiconductor chips include, but not limited to, Gold-Tin-Copper (AuSnCu), Platinum-Tin (PtSn), Gold-Germanium (AuGe), etc.

The extension of the above-mentioned process of mounting one individual semiconductor device to a process of mounting multiple semiconductor devices is limited by thermal interference between the mounted devices. The thermal interference occurs when the solder materials under the previously mounted devices melt during the process of mounting the current device. When the solder material melts, the device above it is basically floating on a molten metal. The surface tension of the molten metal will reposition the device if the device is not held by other forces, causing it to shift from its previously-fixed position. Such shift in position is detrimental to optical systems because, as mentioned above, the relative position between the semiconductor device and the PIC has to be maintained within a very small tolerance. In order to avoid such thermal interference, it is very typical to set a minimal distance between the semiconductor devices under a special heating/cooling arrangement to give a "thermal budget." The thermal budget is given to at least two major considerations: (1) cooling amount between the devices during the heating and (2) overshoot amount to ensure the melting of the solder material.

Figure 3B:
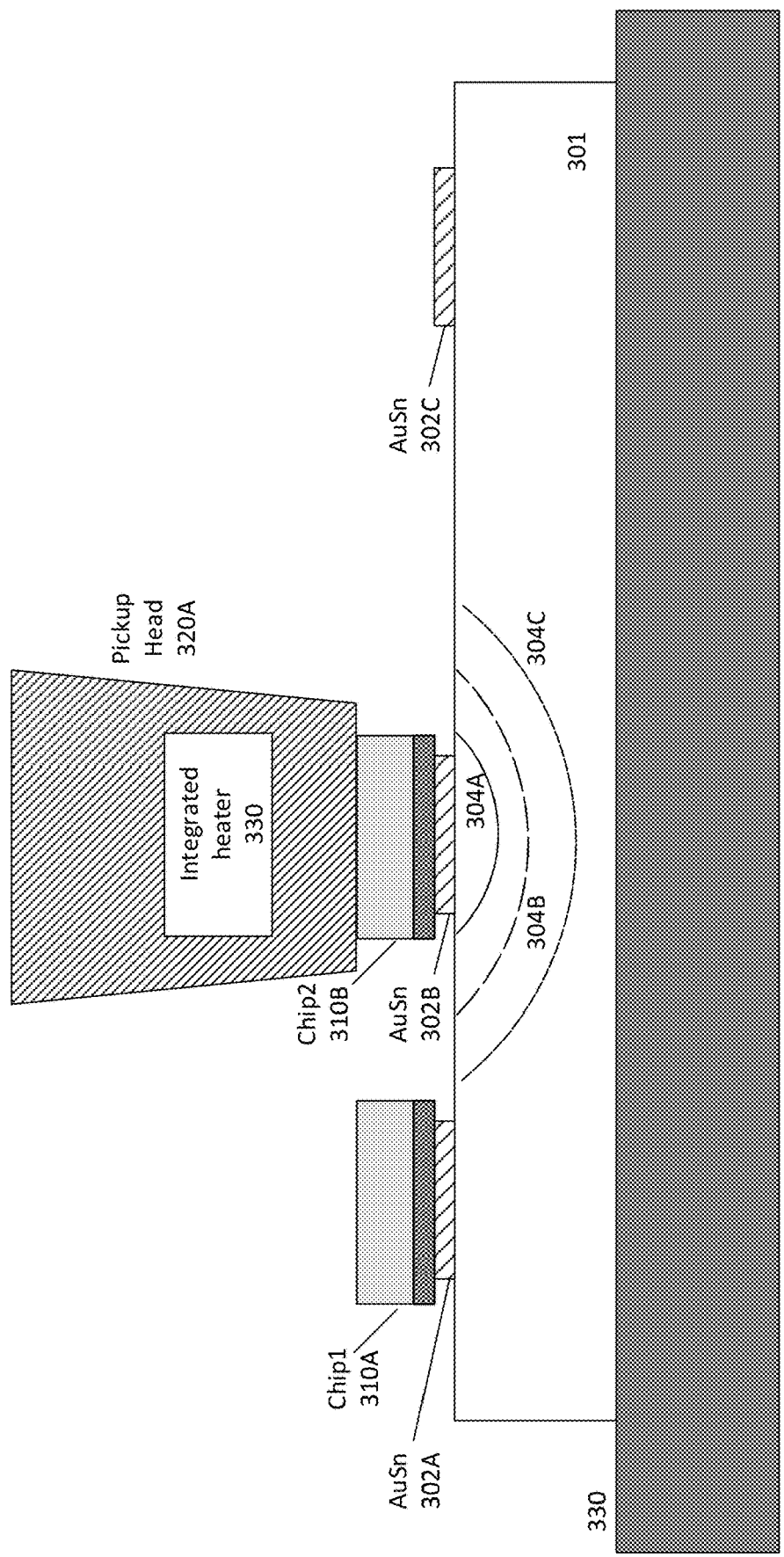
FIG. 3B illustrates a temperature distribution inside a mounting substrate during a process of bonding a laser, according to some embodiments of the present disclosure.

For instance, with respect to cooling amount between the devices, FIG. 3B illustrates the temperature distribution inside the mounting substrate where 304A, 304B and 304C depict equal-temperature lines inside the substrate 301, according to embodiments of the present disclosure. The temperature near Chip2 310B is highest and gradually decreases away from Chip2 310B. The gradient of equal-temperature lines indicates the heat flow from Chip2 310B through the substrate 301 to the moving stage 330. The difference of temperature between 304A and 304C determines whether Chip1 310A is affected during the bonding step of chip 2 302B. In the illustration in FIG. 3B, the cooling amount is 304A-304C. The cooling amount can be enlarged by improving cooling and having localized heating. According to some embodiments, integrated heater 330 is embedded inside the pickup head 320A so that heat is transferred from Chip2 to AuSn solder 302B, then to the substrate 301. If the substrate is very thin, the heat transfers efficiently downward to the moving stage 330. In this case, the lateral heating can be reduced.

In many situations, the thermal design of the mounting setup is limited by the requirements of the optical system. For example, PIC material is under certain strain due to different thermal expansion coefficients of constituent materials. The substrate thickness needs to be maintained with a minimal value to avoid severe warpage or breakage of the substrate. Typically, the substrate thickness is thicker than 250 μm. Silicon is one of the popular choices for PIC and has very high thermal conductivity. The heat transfer laterally is quite effective. This strongly limits the minimal spacing between the devices.

With further reference to FIG. 3B, with regards to overshooting an amount to ensure the melting of the solder material, the thermal process is generally not exactly repeatable within a few degrees C. Among other factors, the thermal contacts between the pickup head to the semiconductor chips have some variations between repeated bonding steps. The initial thermal contact between the semiconductor device and the AuSn material is another variable. These variations of thermal contacts alter the thermal resistances and affect the heat flow pattern. In addition, the composition of AuSn may vary slightly, either between different substrates or within the same substrate due to non-uniformity of the metal deposition processes. Accordingly, the melting point of AuSn material varies. The temperature of the semiconductor chip is raised by heating. This heating process is either controlled by set points or active feedback. The heating process may not be exactly repeatable if the pickup head's starting temperature is not identical between repetitions. When the mounting process does not reach a sufficient temperature, cold solder joint is formed which is well known for its poor long-term reliability. To ensure proper melting of AuSn material, the highest process temperature is typically 30° C. (overshoot) higher than the nominal melting point of the AuSn material. The larger the overshoot amount is, the lower failure rate of the mounting process.

The thermal budget equals the cooling amount subtracted by the overshoot amount. If the thermal budget is negative, the process will lead to an increased failure rate. If it is positive, it can be used to allow additional process variations not included in the above analysis, such as ambient temperature, air flow, different thermal property at different locations on the mounting substrate, etc. Therefore, a positive thermal budget is to be maintained for a high-yield laser mounting process.

From this above discussion, it is therefore highly desirable to increase the thermal budget without affecting the compactness of the system design and the system performance. The present invention described herein provides an inventive approach to increase the thermal budget or reduce the minimal distance between bonded semiconductor chips without impacting the system performance. A proper design of the bonding process is to maintain a sufficient distance between lasers under the bonding setup conditions to ensure positive thermal budgets. In other words, the lasers are said to be sufficiently distanced when having positive thermal budgets under designed bonding conditions with certain process variations.

Figure 4A:
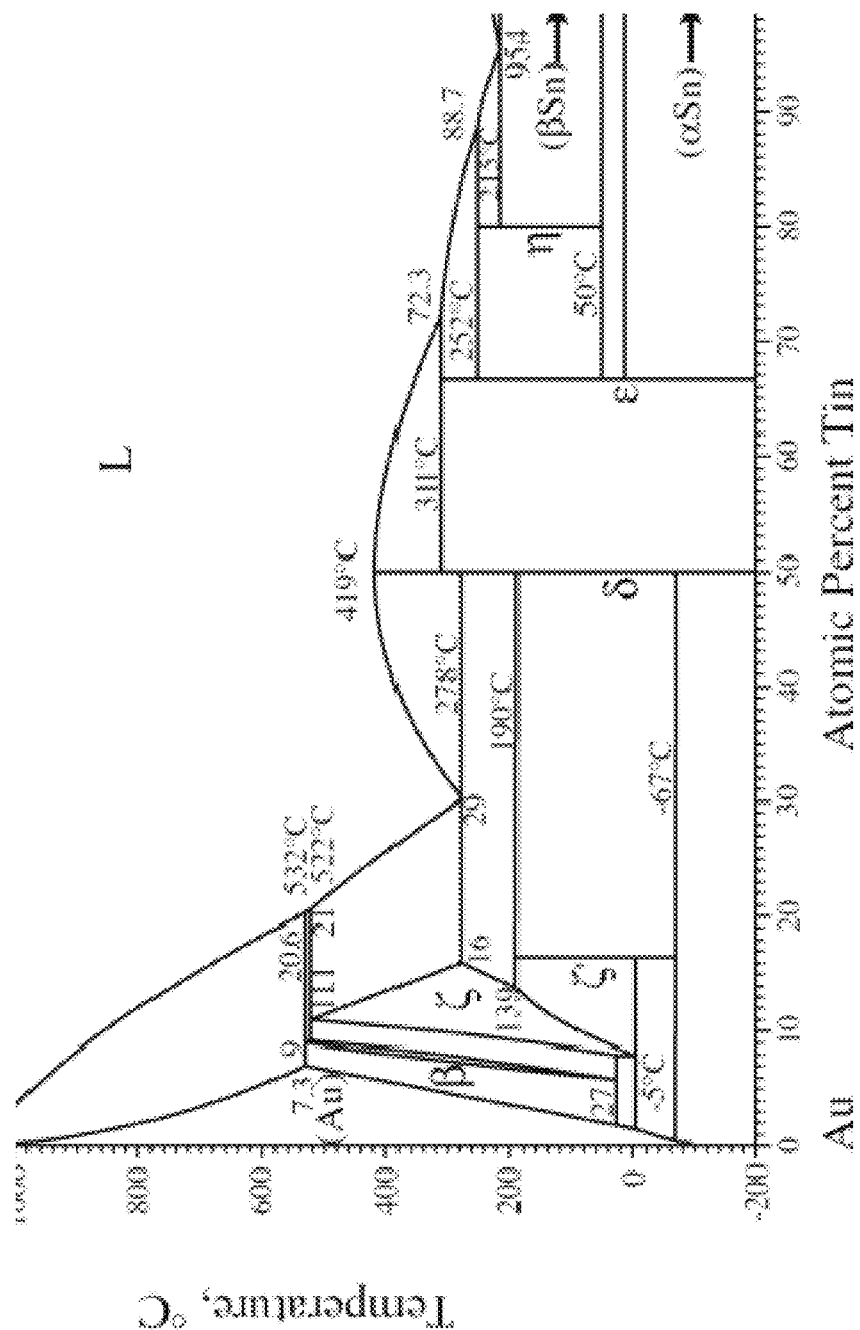
FIG. 4A is a phase diagram of Gold-Tin (AuSn).

FIG. 4A is a phase diagram of AuSn alloy system. The horizontal axis is the relative amount of Sn either by atomic percentage (the bottom scale) or by weight percentage (the top scale). For all discussions herein, atomic percentages are used to refer AuSn compositions. For example, "Au71Sn29" refers to 71 Au atoms and 29 Sn atoms out of a total of 100 atoms. There are two eutectic points in the AuSn system Au71Sn29 at 278° C. and Au4.6Sn95.4 at ~232° C. While Au4.6Sn95.4 has a lower melting point than that of Au71Sn29, Au71Sn29 is more popular for better mechanical stability and being less prone to oxidation.

When Au71Sn29 is used as the solder material to mount multiple semiconductor devices, the overshoot amount during the heating process must be less than the cooling amount caused by the lateral heat transfer. The larger overshoot amount, the larger distance between devices is required.

Figure 4B:
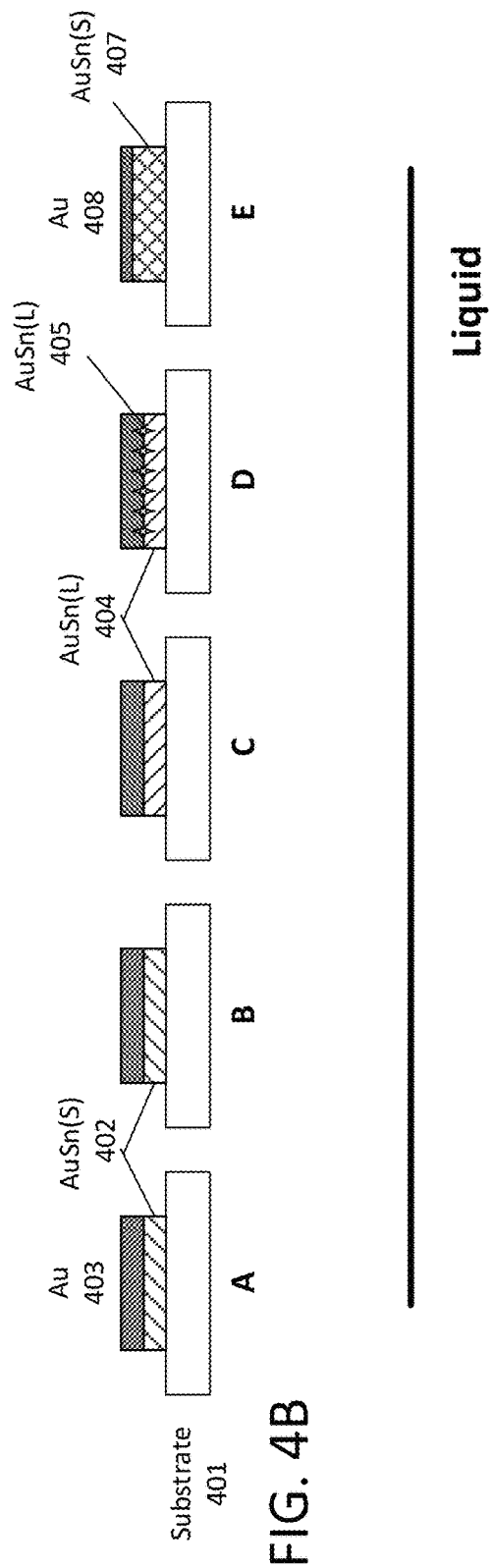
FIG. 4B illustrates a metal system comprising a layer of Au and a layer of Au71Sn29 on a substrate, according to some embodiments of the present disclosure.
Figure 4C:
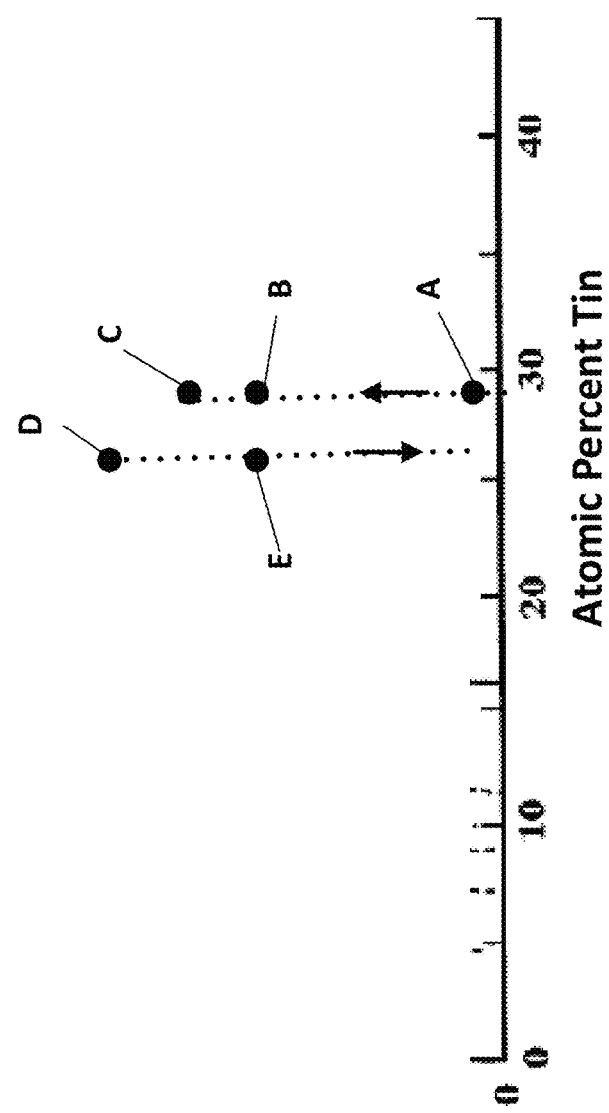
FIG. 4C is an expanded Au—Sn phase diagram, according to some embodiments of the present disclosure.
Figure 4D:
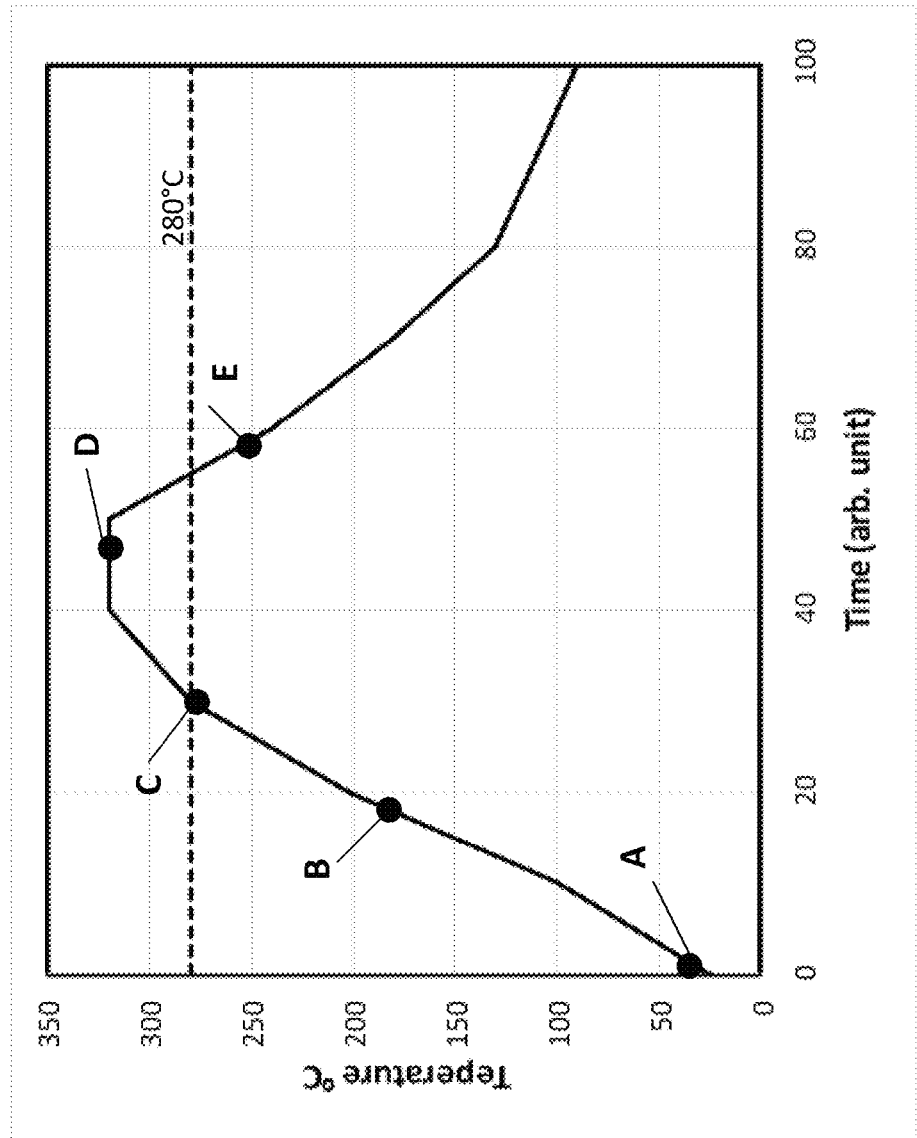
FIG. 4D depicts a temperature-time profile of a bonding process according to some embodiments of the present disclosure.

FIG. 4B illustrates an Au/AuSn system where an AuSn layer 402, on a substrate 401, is capped with an Au layer 403 having a sufficient thickness, according to some embodiments of the present disclosure. A to E designate 5 instants which are cross-referenced between FIG. 4B, FIG. 4C and FIG. 4D. FIG. 4D depicts a temperature-time profile of a bonding process. As shown in FIG. 4D, the temperature of Au/AuSn system is brought from room temperature to a peak temperature and back. When at Instant A, the temperature is at room temperature (or a preheated temperature). At the same time as shown in FIG. 4C, the AuSn 402 at Instant A is Au71Sn29(S), where (S) means solid phase. When the temperature reaches to Instant B, nothing happens because the temperature is below the eutectic point, 279° C. As shown in FIG. 4B, AuSn(S) 402 remains solid phase. However, at Instant C, the temperature just reaches above the eutectic point, AuSn layer melt and become AuSn(L) 404 in FIG. 4B where (L) means liquid phase. At this point, AuSn(L) 404 remains Au71Sn29. While the temperature continues to rise from Instant C to Instant D, AuSn(L) 405 begins to dissolve Au layer 403 above it. This process is analogous to ice gradually melt into seawater which has a lower melting point than ice when the seawater temperature rises. In this analogy, the amount of ice decreases while the water percentage of seawater increases accordingly. Similarly, during the bonding process, the Au content of AuSn(L) 405 at the interface gradually increases. The composition of AuSn might not be uniform because Au migrates from the top to the lower AuSn(L) 404. However, the dissolution of Au is self-limiting as soon as the overall AuSn composition becomes Au74Sn26 at Instant D. At this point, the alloy becomes a mixture of liquid phase of AuSn(L) and AuSn(S). Further dissolution process becomes very slow due to poor diffusion process of Au in the mixture. As a result, when the temperature is brought back to a temperature below 280° C. at Instant E, AuSn(S) layer 407 becomes Au74Sn26(S). In other word, the temperature excursion by the bonding process causes the intermixing of top Au layer 403 and bottom AuSn layer 402. The intermixing of material causes the change of the composition of resulting AuSn layer 407, having a higher melting point than that of initial AuSn(S) layer 402.

The important aspect of the configuration of the Au/AuSn metal system depicted in FIG. 4A is that the composition of AuSn is altered after the temperature cycle. When the temperature is brought to 279° C. again, the resulting Au74Sn26(S) will not melt. In fact, the resulting Au74Sn26 (S) will melt only when the temperature reaches the temperature of the previous peak (Instant D) which is 325° C. in the temperature profile of FIG. 4D. The tolerance of the AuSn system is increased by an amount precisely the same as the overshoot amount.

The above analysis actually does not work for mounting multiple semiconductor devices if the Au/AuSn is deposited on the substrate as shown in FIG. 4A. This is because during the first heating cycle, all Au/Au71Sn29 layers will be converted into Au74Sn26(S). The next temperature excursion will not melt the resulting Au74Sn26(S) at 279° C.

Figure 5A:
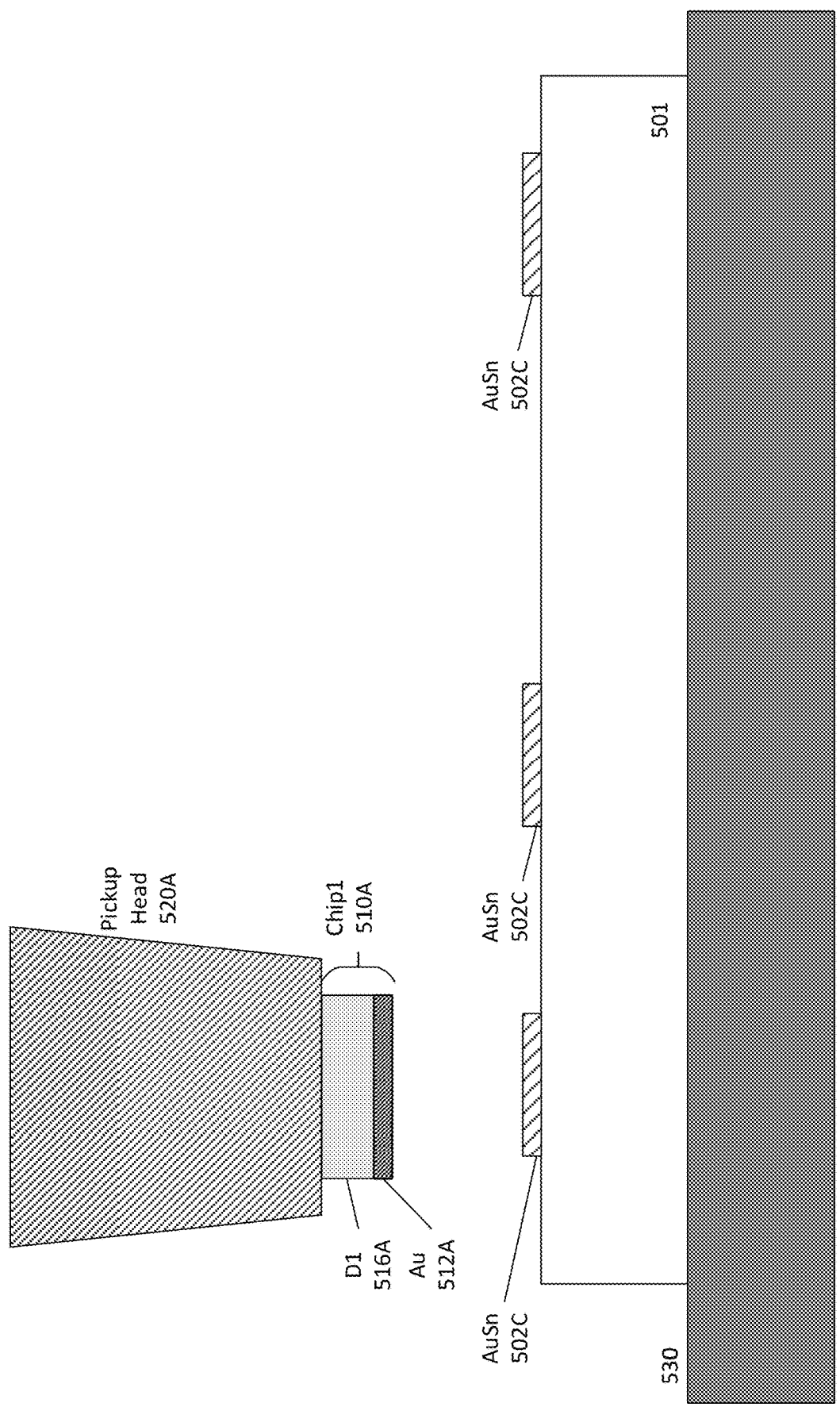
FIG. 5A shows an alignment setup having a moving stage and a pickup head which positions the laser respect to the substrate on the moving state, according to some embodiments of the present disclosure.

According to some embodiments of the present invention described herein, the Au layer and the Au71Sn29 layer are physically separated initially to facilitate the mounting of multiple semiconductor devices. As shown in FIG. 5A, Au layer 512A is deposited on semiconductor device, D1 516, and AuSn layers 502C are deposited on a substrate 501. Before pickup head 520A brings Chip1 510A to contact AuSu layer 502C on the substrate 501, no matter how many temperature excursions above the melting point of the AuSn layers 502C, their compositions do not change. This is one important aspect of the multiple mounting process described herein.

Figure 5B:
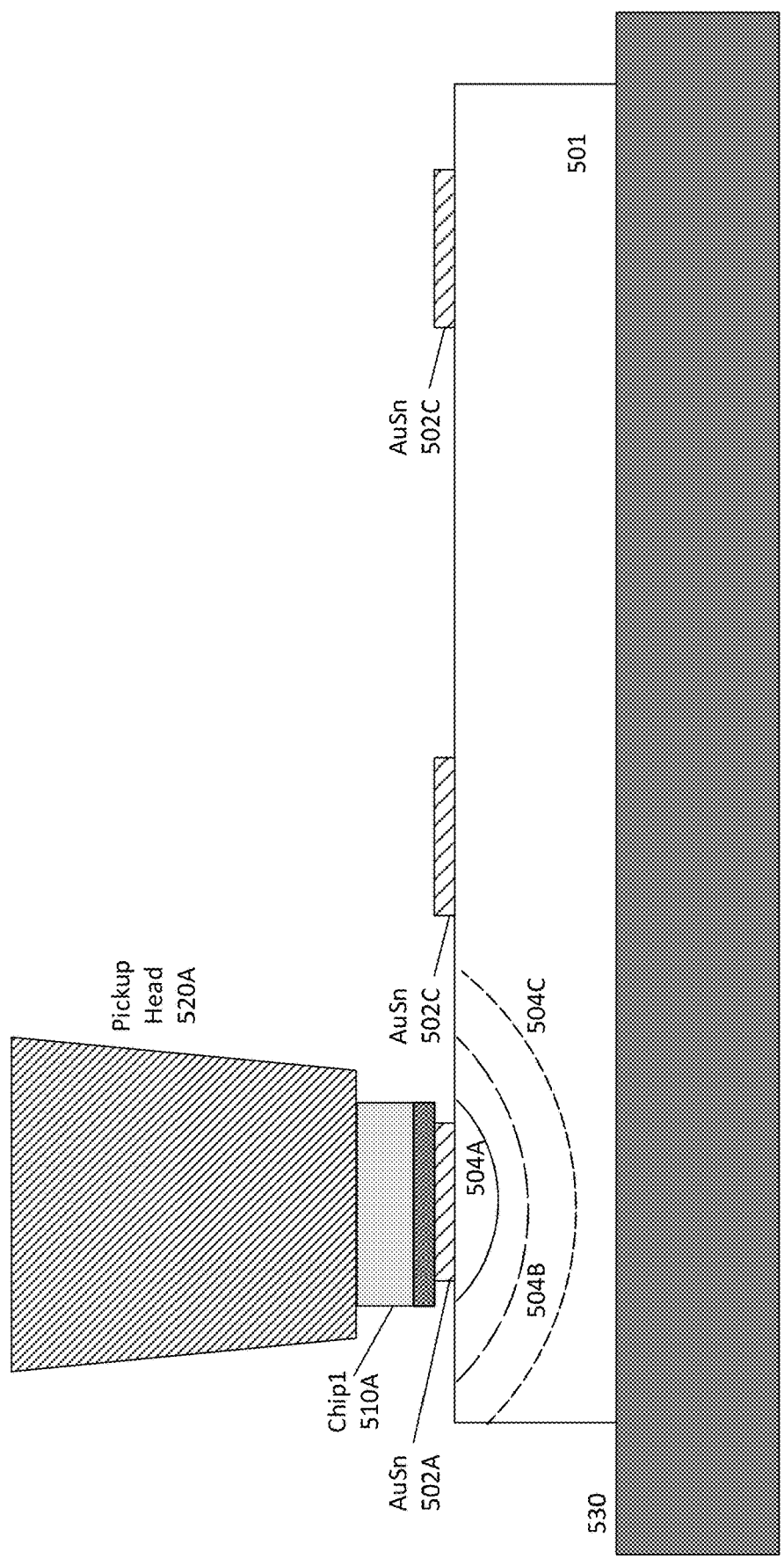
FIG. 5B illustrates a temperature distribution with equal-temperature lines inside the mounting substrate when a first laser is being bonded to the substrate, according to some embodiments of the present disclosure.

Only when, in FIG. 5B, Chip1 510A is brought to contact the AuSn 502C layer along with a temperature higher than the melting point of AuSn 502C, the process of intermixing described in FIG. 4B will take place. As a result, the resulting composition of AuSn 502A has more Au than that of the original AuSn 502C, thus increasing its melting point while other AuSn materials (502C) remain their original compositions.

Figure 5C:
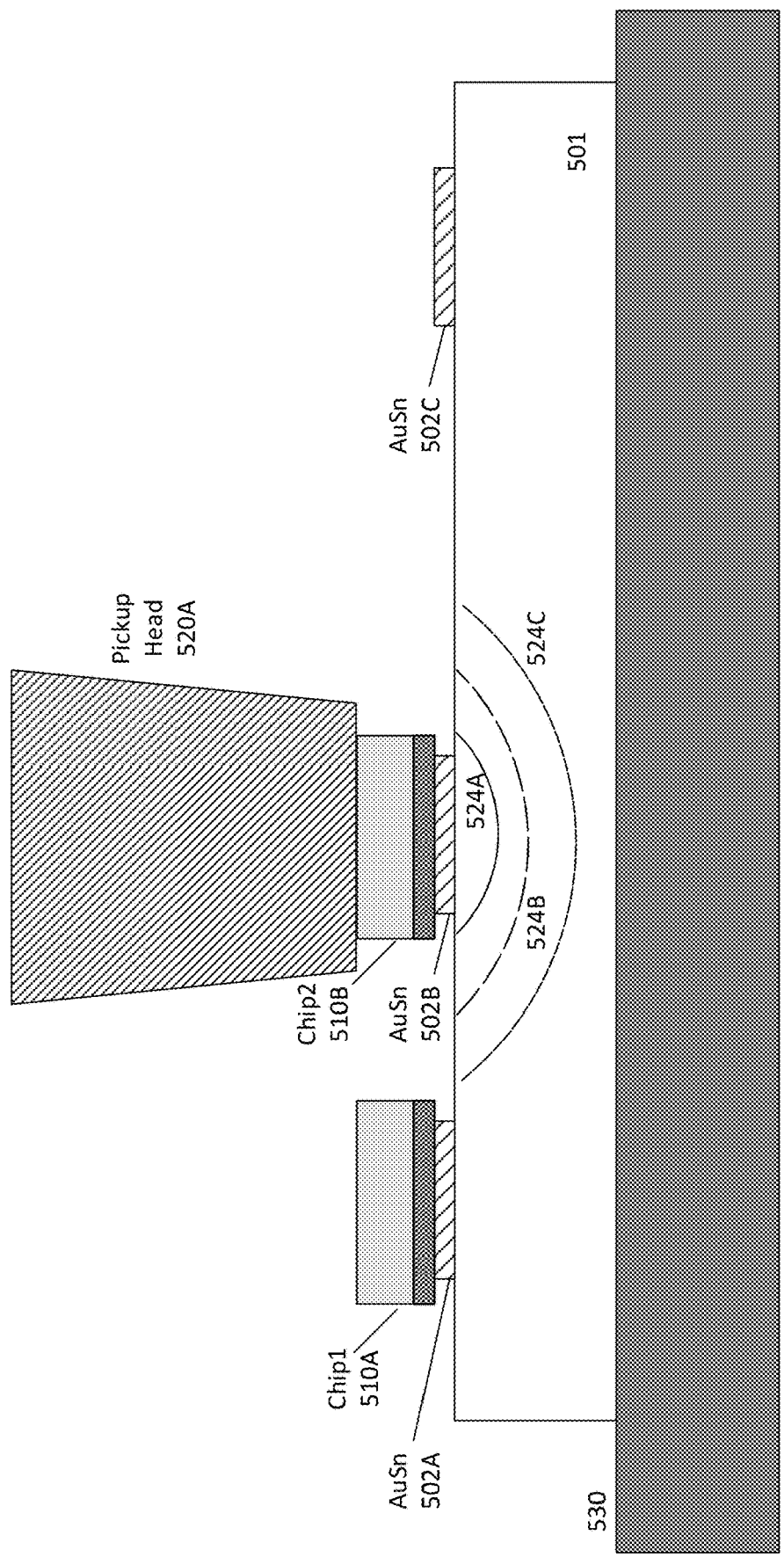
FIG. 5C illustrates the temperature distribution inside the mounting substrate when a second laser is being bonded to the substrate, according to some embodiments of the present disclosure.

As shown in FIG. 5C, where rickup head 520A brings Chip2 510B to contact AuSn 502C layer along with a temperature higher than the melting point of AuSn 502C, the process of intermixing described in FIG. 4B will take place. As the result, the resulting composition of AuSn 502B has more Au than that of the original AuSn 502C, thus increasing its melting point while other AuSn materials (502C) remain their original compositions. It is important to note that the melting point of AuSn 502A under Chip1 is higher than the melting point of AuSn 502C. If the peak temperature during the temperature excursion of Chip2 is exactly the same as that of Chip1, Chip1 will not be affected as long as there is some small cooling amount between Chip1 and Chip2.

If the temperature profile can be controlled precisely, the thermal budget is always positive as long as the adjacent devices are a little cooler than the current device being mounted.

Figure 6A:
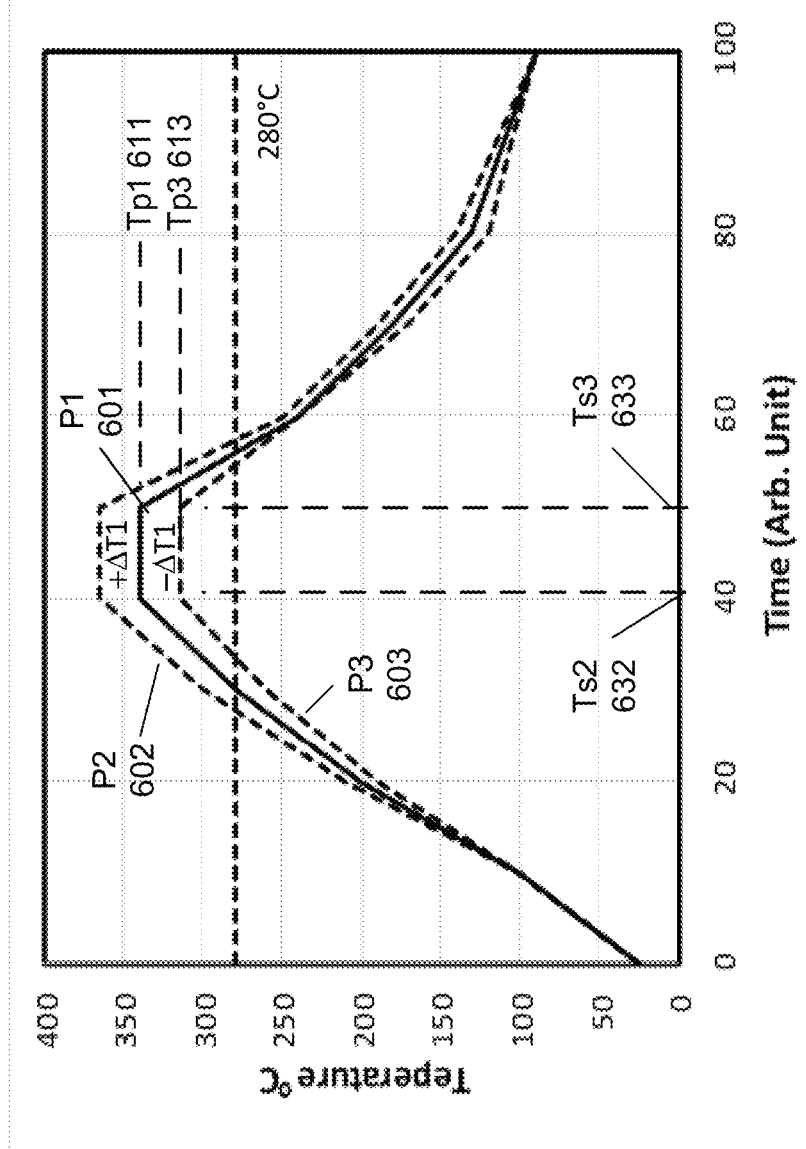
FIG. 6A illustrates temperature variations of the bonding process, according to some embodiments of the present disclosure.

However, such precise temperature control might be difficult to achieve in an actual assembly setup because of the variations of processes and materials as discussed previously. FIG. 6A shows three temperature profiles. P1 601 is the intended temperature profile. Generally, an intended temperature profile is generated by a common set of temperature set points and time duration. For example, in FIG. 6A, at the time zero, the heat can be turned on with a destination of a targeted temperature Tp1 611 to be reached at the time of Ts2 632. Once reaching Tp1 611, the heater power is changed to maintain the temperature of the device at Tp1 611 until the time of Ts3 633. The heater power is removed at Ts3 633 and the temperature of the device starts to cool down. It should be appreciated that the curve of temperature profiles depicted in FIG. 6A is only for illustrative purposes. The actual temperature profile can vary from the temperature set points due to variation of the assembly setup.

Figure 6B:
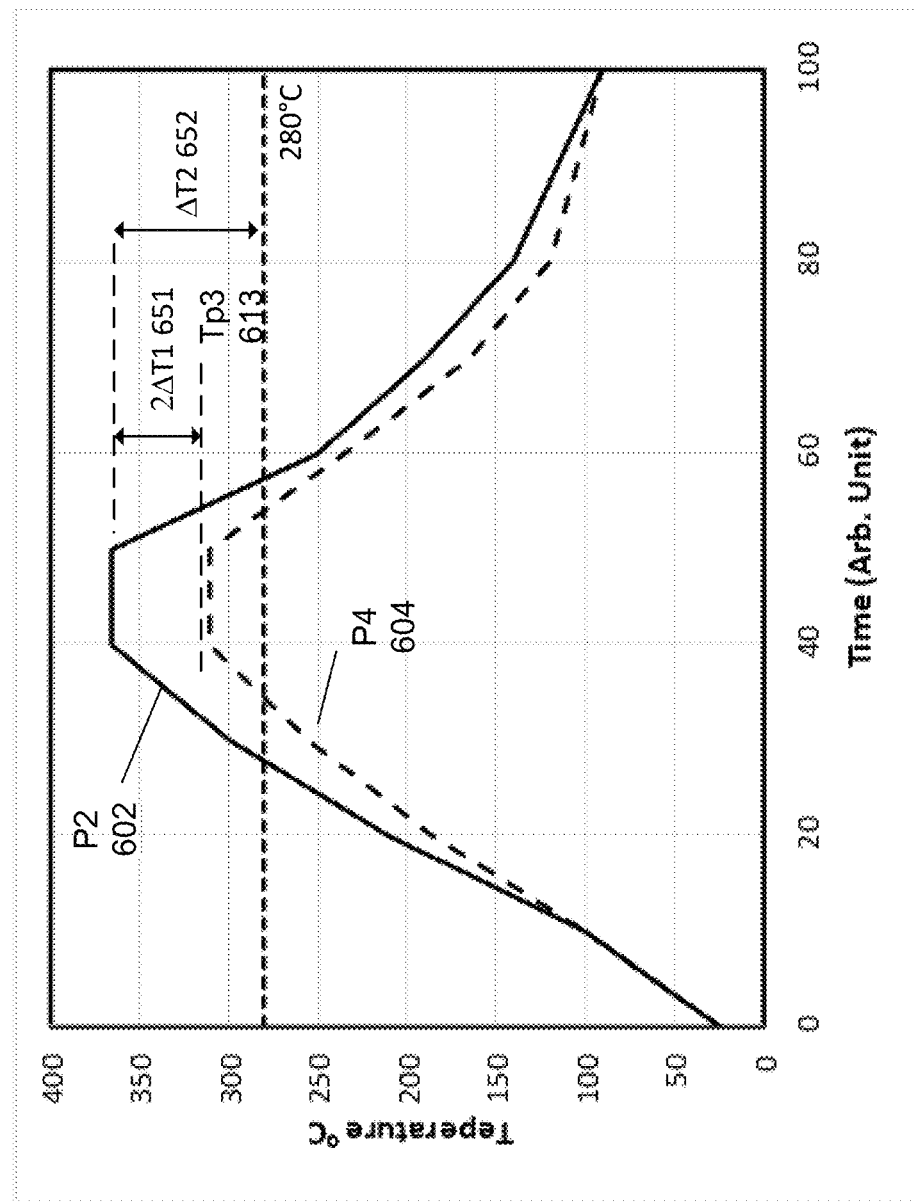
FIG. 6B illustrates a temperature profile, P4, of a neighbor location when the current laser is bonded, according to some embodiments of the present disclosure.

P2 602 illustrates the upper bound of an actual temperature profile and P3 603 illustrates the lower bound of an actual temperature profile. P1 601, P2 602 and P3 603 represent the process variations between repeated temperature excursions which are generated from a common set of temperature set points and time durations. The amount of +ΔT1 represents the variations of the peak temperatures and Tp3 613 represents the peak temperature of the lower bound temperature profile P3 603 of FIG. 6A. FIG. 6B depicts a worse scenario when a nearest neighboring device is completed with P3 603 (which has a peak temperature of Tp3 613) and the current mounting process is executed with P2 602. P4 604 depicts the temperature profile at the nearest neighboring device when the current bonding process is being conducted. The temperatures in P4 604 are lower than the temperatures in P2 602 at any time instances because of the cooling amount as discussed previously (FIG. 5C). As long as the peak temperature of P4 604 is lower than Tp3 613, all previous bonded lasers at the neighboring locations will not be impacted. This is equivalent to having an overshoot amount of 2ΔT1 651. On the other hand, if using a traditional Au71Sn29 system, the overshoot amount is ΔT2 652 as shown in FIG. 6B. It can be appreciated that the equivalent overshoot amount of the present invention described herein is smaller than the traditional overshoot amount by the amount of the lowest overshoot amount.

With a smaller overshoot amount, the requirement cooling amount is reduced while maintaining a positive thermal budget. A smaller cooling amount can be translated to a smaller distance between devices. Thus, the present invention described herein can help reduce the size of the PIC chip, subsequently the cost of the PIC chip.

The above description uses a precise Au71Sn29 as an example. However, because of the equivalent overshoot amount of the present invention described hereabove, according to the embodiments of the present disclosure, the requirement of the composition of AuSn is further relaxed as described hereafter.

Figure 7:
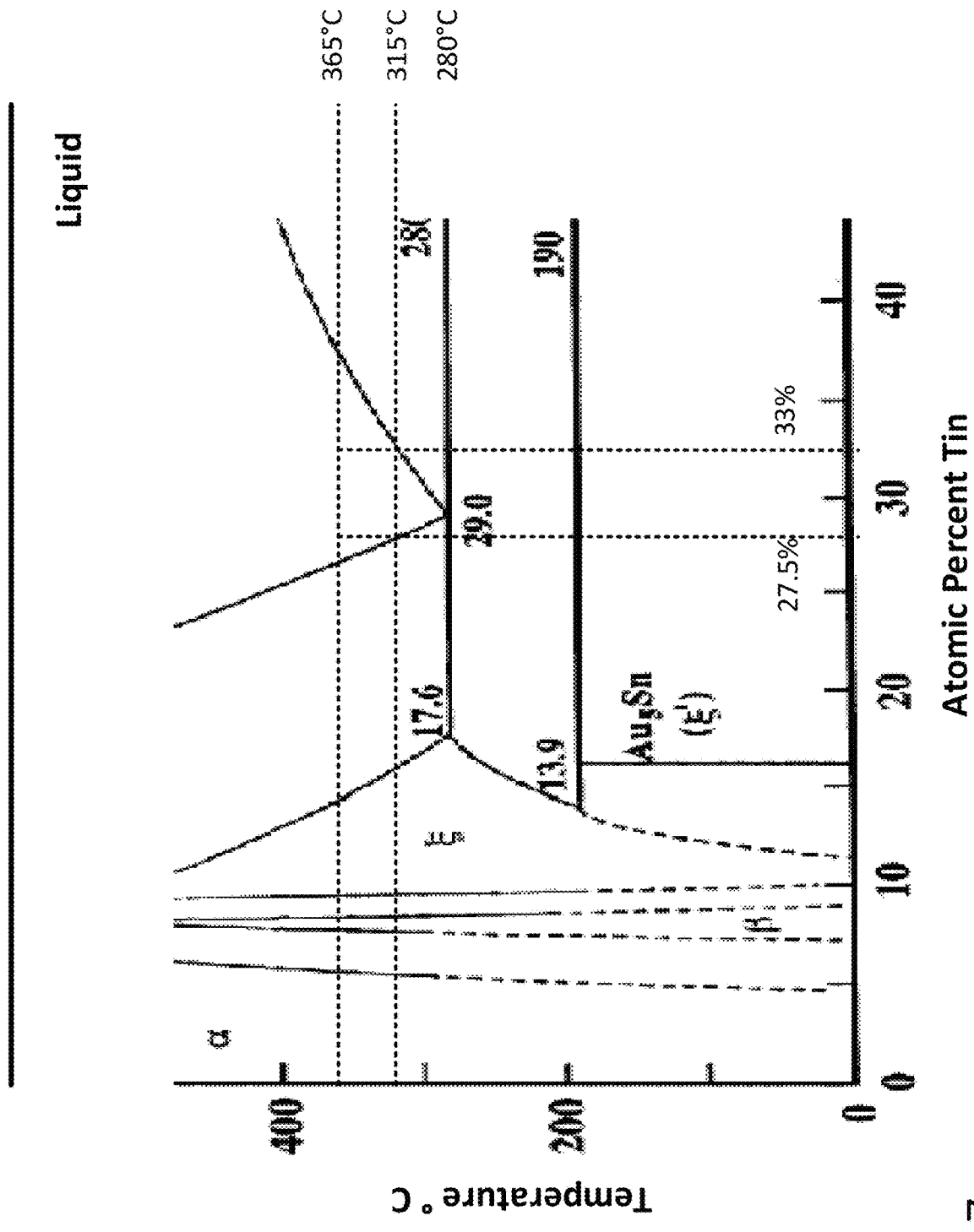
FIG. 7 illustrates the tolerance of the initial AuSn compositions acceptable to the process tolerance with peak temperatures between 315° C. and 365° C., according to some embodiments of the present disclosure.

FIG. 7 depicts the acceptable range of AuSn composition for a given process variation, according to some embodiments of the present disclosure. In general, it is important to obtain precise AuSn composition uniformly across the substrate or consistently between substrates so that the thermal budget can be better controlled. With the present invention described herein, the initial composition plays a smaller role in affecting the thermal budget. As explained previously, the dissolution of the Au layer of the semiconductor chip is self-limiting by the peak temperature of the temperature excursion. If there is sufficient Au, a matching amount of Au will be dissolved into AuSn material to reach its final composition. Using the examples in FIG. 6A, the peak temperature varies from 315° C. to 365° C. For the case of peak temperature of 315° C., the AuSn alloy having initial composition from 27.5% of Sn to 33% of Sn will be all converted into Au73Sn27 because they will all melt below 315° C. Once they are converted in Au73Sn27, they are stable up to 315° C., independent of their original compositions. It is important to know that the example in FIG. 7 is only for illustration purposes. If a much wider composition variation is desirable, one only needs to increase the peak temperature of a lower bound of temperature profile. Clearly, the present invention described herein not only improves the tolerance to process variations but also the tolerance to the material variation simultaneously. Increasing the tolerance to material composition means the broader acceptance of the parts from different vendors or different processes for deposing the AuSn materials, thus further reducing the manufacturing costs.

According to some embodiments, the initial AuSn material can be accomplished by variety of approaches as exemplified in FIG. 8A to FIG. 8F.

Figure 8A:
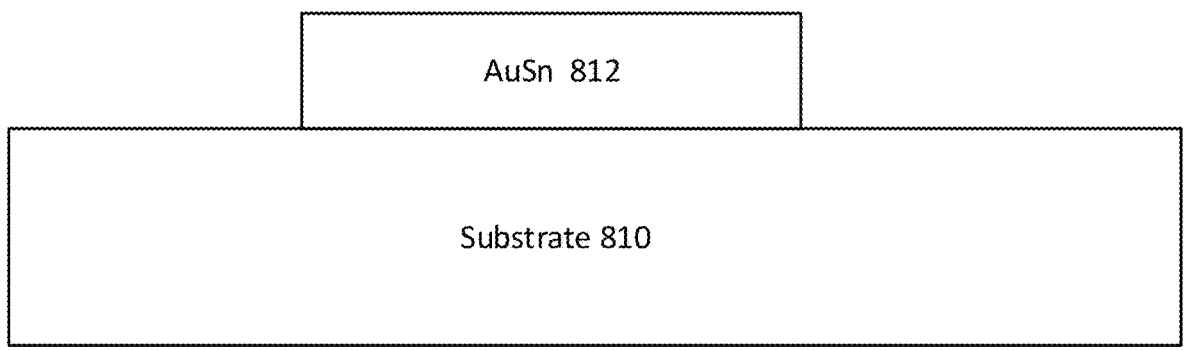
FIG. 8A-8F depicts various metal systems having similar overall AuSn compositions, according to some embodiments of the present disclosure.

FIG. 8A shows an embodiment with a single AuSn layer 812 on top of substrate 810. The composition of the AuSn layer 812 is preferably close to Au71Sn29. However, as explained previously, the range of the composition is determined by the peak temperature of the temperature excursion of the mounting process. Typically, Sn compositions between 26% and 35% are usable.

Figure 8B:
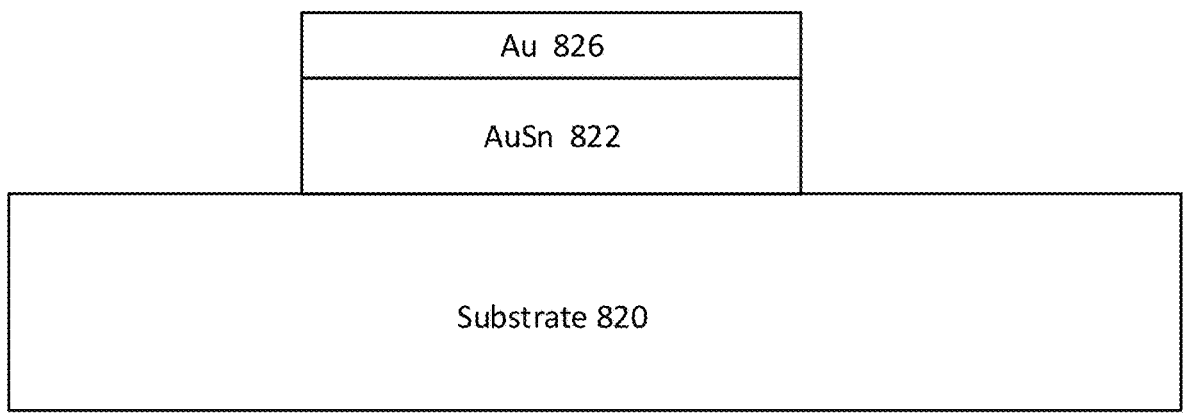

FIG. 8B shows an embodiment with an Au layer 826 on top of an AuSn 822 on substrate 820. The purpose of this Au layer 826 is to avoid oxidation of Sn at the AuSn surface during handling or a process with high temperature. In this case, the overall composition of AuSn should include this Au layer 826. For this reason, the thickness of the Au layer 826 should be sufficiently thin so that the underneath AuSn 822 has a melting point lower than the peak temperature of the temperature excursion of the mounting process. Once the AuSn layer 822 melt, the Au layer 826 is dissolved and intermixed with the AuSn layer 822, resulting in the targeted composition of the design.

Figure 8C:
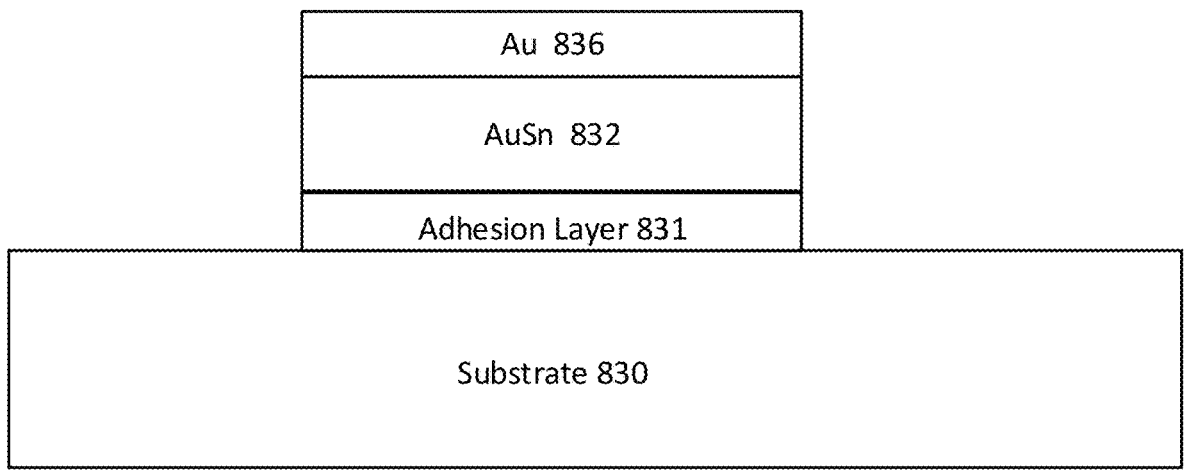

FIG. 8C shows an embodiment with an adhesion layer 831 between similar metal layers as in FIG. 8B and a substrate 830. The purpose of the adhesion layer 831 is to improve the adhesion between the AuSn layer 832 and the substrate 830. It is known that AuSn materials of certain compositions have less adhesion to Silicon or Silicon Dioxide. The adhesion layer is important for long term reliability. Further, the adhesion layer 831 should not be dissolvable to AuSn during the mounting process. If a preferred adhesion layer is dissolvable to AuSn, an additional "barrier" layer should be inserted between the adhesion layer 831 and the AuSn layer 832. Commonly used adhesion material are Titanium (Ti), Chromium (Cr), and Nickel (Ni). A common barrier material is Platinum (Pt).

Figure 8D:
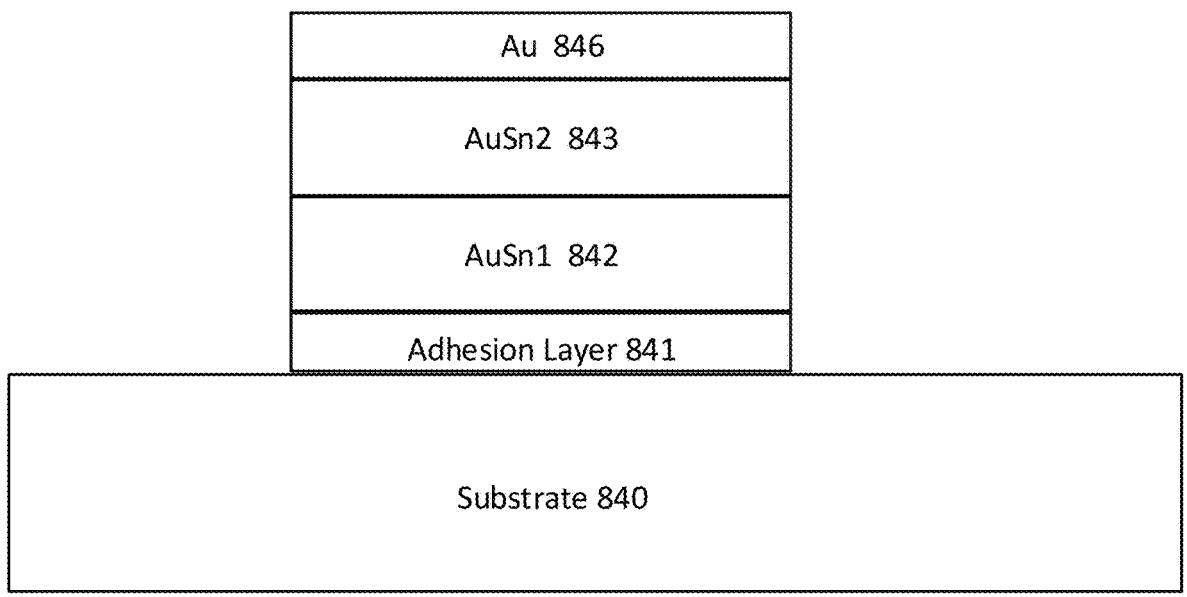

FIG. 8D discloses another embodiment which employs two AuSn layers (AuSn1 842 and AuSn2 843) sandwiched between a top Au layer 846 and an adhesion layer 841. For example, the AuSn2 layer 843 is Au5Sn95 which has melting point of 213° C. which is substantially lower than that of AuSn1 842 (e.g. Au75Sn25). The advantage of having AuSn2 is to improve the wetting process during the mounting process. The thicknesses of AuSn2 layer 843, the AuSn1 layer 842 and the Au layer 846 are designed so that, after mixing, the overall composition is close to the targeted composition.

Figure 8E:
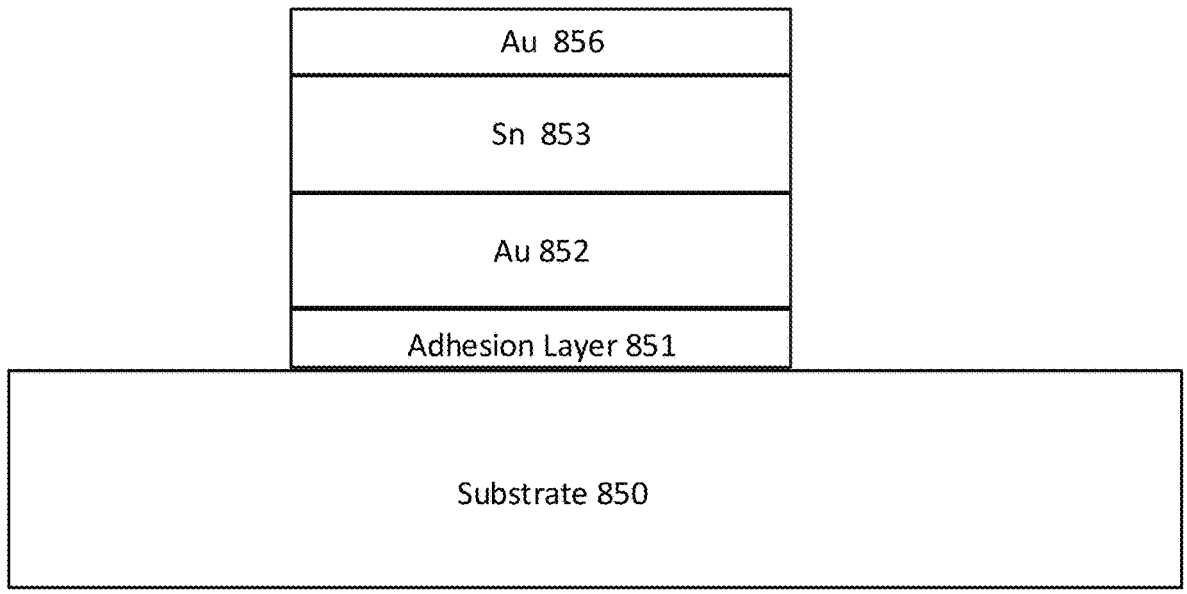

FIG. 8E discloses another embodiment to accomplish a desired AuSn composition by depositing an Au layer 852 and a Sn layer 853 separately. This approach allows using elementary material sources and controlling the composition by thickness ratio. In some deposition techniques (such as e-beam evaporation), AuSn deposition is not exactly repeatable. The thicknesses of elementary sources are easier to control in these deposition systems.

Figure 8F:
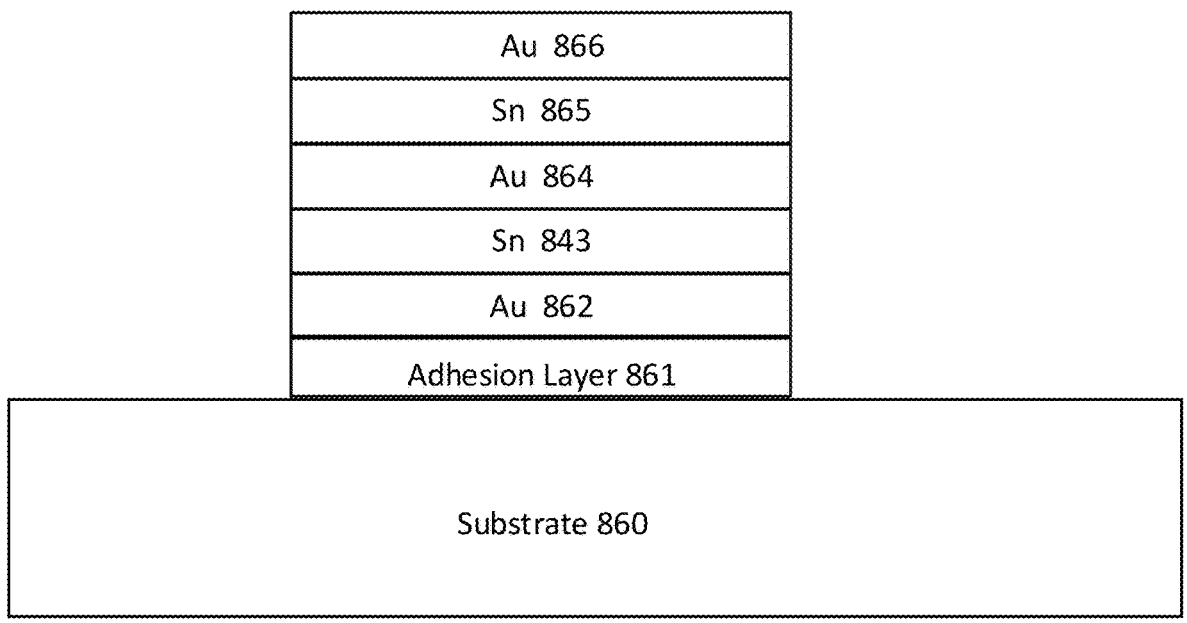

FIG. 8F discloses a variant of FIG. 8E where multiple Au layers and multiple Sn layers are deposited. This sandwich structure is useful when the overall thickness is large. It is known that thick Sn layer might have high tensile stress. Sandwiching Sn layers 865 and 863 with Au layers 866, 864 and 862 improves the integrity of the metal system.

According to some embodiments, the AuSn layer is preferably deposited by a plating process. AuSn is an expensive material. Plating process can selectively deposit material only to the area needed, unlike other semiconductor processes such as sputtering and evaporation. The process of the deposition of AuSn is exemplified in the flowchart 900 in FIG. 9.

Figure 9:
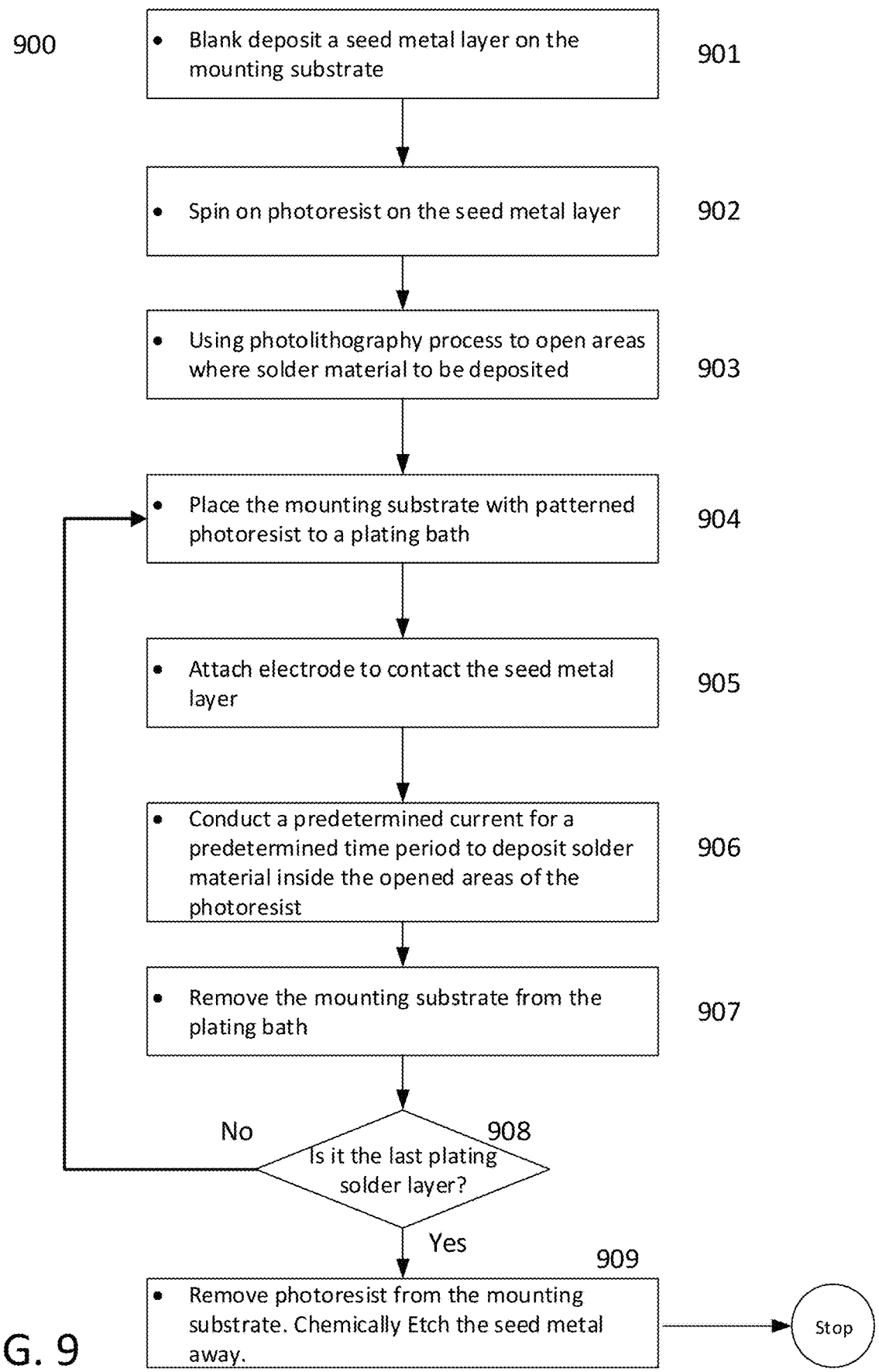
FIG. 9 illustrates a process to deposit multi-layer AuSn alloy, according to some embodiments of the present disclosure.

As shown FIG. 9, at step 901, the surface of the substrate is coated with a seed metal layer which can be selectively etched away by wet chemical process after the plating process is finished. Typically, the seed layer also provides enhanced adhesion between AuSn and the substrate. The choices of the seed layer are among, but not limited to, Ni, Ti, and Cr. After the seed layer is deposited, at step 902, a photoresist is spun on the seed layer. In step 903, using a photolithography process, the open areas are defined using a mask aligned to the critical feature to the PIC patterns. The thickness of the resulting photoresist should be thicker than the final thickness of the plated AuSn material. At step 904, the patterned substrate is immersed in a plating solution for the intended metal. At step 905, the electrical contact is made to the seed layer. At step 906, perform the plating process based on desired amount of current and time. The thickness of the plated material is proportional to the product of the current and the time and inversely proportional to the total opened area. At step 907, remove the substrate from the plating bath. And, at step 908, if there is more material layer to be plated, repeat the step 904 to 908. Otherwise, at step 909, remove photoresist by solvent and subsequently remove the seed metal not covered by the plated material with a selective chemical etching.

Once the AuSn material is deposited on the mounting substrate, semiconductor devices having sufficient Au coating can be sequentially mounted to the mounting substrate. It is desirable to have the Au layer on the semiconductor devices to be sufficiently thick. Use Au71Sn29 in FIG. 4C as an example. Let's assume the initial thickness of Au71Sn29 is 1000 nm. To be converted into Au74Sn26, approximately 115 nm of Au will be dissolved into 1000 nm thick Au71Sn29 material. As long as the Au layer on the semiconductor device is thicker than 115 nm, the result is the same because the dissolution process is self-limiting. However, if the Au layer is too thin, the resulting composition will have a lower melting point than the peak temperature of the temperature excursion, reducing the thermal budget. If the initial thickness of Au71Sn29 is increased by a factor, the amount of "sufficient" Au is proportionally increased. According to this estimate, the "sufficient amount of Au" is an Au layer which is thicker than 11.5% of the overall thickness of AuSn having an overall composition close to Au71Sn29. It should be appreciated that the sufficient amount can vary due to the bonding temperature range and the initial AuSn alloy composition. For example, if the intended bonding temperature is higher than 365° C., the sufficient amount of Au is larger than 11.5% of the overall thickness of Au71Sn29. Likewise, if the initial AuSn composition contains Sn more than 29%, the sufficient amount is increased as well.

According to some embodiments, the mounting setup comprises a pickup head integrated with a heater moving in z-direction, an X-Y moving stage and an alignment mechanism. The alignment mechanics can be either passive alignment provided by visual aids, mechanical stops, etc., or active alignment with actual signal detected from the PIC. An integrated heater to the pickup head can be used to provide local heating to cause lateral temperature gradient. However, alternatively, focused laser radiation or integrated heating element on the mounting substrate can be used.

The mounting process is exemplified by flowchart 1000 in FIG. 10 in accordance with some embodiments of the present disclosure. At step 1001, a mounting substrate having receiving AuSn pads is loaded to the moving stage. The entire substrate and the stage is preheated to a predetermined temperature (typically −200° C.). The preheating of the substrate can reduce the process time and improves the repeatability of the process. At step 1002, a laser is picked up by a pickup head. The lasers are usually pretested as known-good dies.

At step 1003, with visual aid, the pickup head positions the laser on top of a receiving AuSn location. One example of such visual aid is an infrared camera underneath the substrate which can see through the substrate. Therefore, by fiducial patterns, the X-Y alignment can be accomplished.

At step 1004, the pickup head lowers the laser to make physical contact. If active alignment is employed, the laser can be electrically driven to produce light. A detection of light coming from a PIC element on the substrate can be used to further optimize the alignment. When the alignment is satisfactory, at step 1005, a local heater is turned on to raise the temperature of the laser according to a predetermined temperature set point for a desired peak temperature. At step 1006, the laser is kept at the peak temperature for a predetermined time duration. During this time duration, the intermixing of the metal system as described in FIG. 4B takes place. And, at step 1007, the local heater is turned off and the laser is let to cool down naturally or by forced air flow.

At the completion of step 1007, if there are more lasers to be mounted (step 1008), repeat step 1002 to 1008. Otherwise, at step 1009, the assembled substrate with lasers is removed from the bonding setup.

It should be appreciated that, although the bonding processes illustrated in flowchart 1000, are generated by a common set of predetermined temperature set points and time durations, the actual temperature profile of each bonding processes can vary somewhat caused by the variations of process, materials, geometries, etc. as described above.

It should be appreciated that, although only a few predetermined temperature set points and a time duration are used to illustrate flowchart 1000, more temperature set points and more time durations can be used to achieve more complicated temperature profiles.

While flowchart 1000 is used for mounting lasers, people having ordinary skills in the arts will understand the same process can be used to mount other semiconductor chips sequentially. Further these semiconductor chip are not necessarily of the same kind. For example, the first chip can be a laser and the second chip can be a photodetector.

The mounting process is further exemplified by flowchart 1100 in FIG. 11 in accordance with embodiments of the present disclosure.

At step 1101, a mounting platform is loaded to the moving stage. This mounting platform can be a submount, a substrate, or a PIC chip. The platform has multiple receiving locations coated with AuSn material as described in FIG. 8A-F. Semiconductor chips to be mounted are usually pretested as known-good dies. The semiconductor chips are coated with sufficient Au as discussed previously.

At step 1102, with visual aid, a pickup head picks up and positions a semiconductor chip on top of a receiving AuSn location. One example of such visual aid is an infrared camera underneath the substrate which can see through the substrate. Therefore, by fiducial patterns, the X-Y alignment can be accomplished.

Then, the pickup head lowers the semiconductor chip to make physical contact. When the alignment is satisfactory, at step 1103, a local heater is turned on to raise the temperature of the semiconductor chip according to a predetermined set point for a predetermined time duration. During this time duration, the intermixing of the metal system as described in FIG. 4B takes place. After this time duration, the heater is turned off to let the semiconductor chip to cool down.

At step 1104, the pickup head picks up and positions a next semiconductor chip on top of a next receiving AuSn location. The pickup head lowers the semiconductor chip to make physical contact. When the alignment is satisfactory, at step 1105, a local heater is turned on to raise the temperature of the semiconductor chip according to the same predetermined set point for the same predetermined time duration. During this time duration, the intermixing of the metal system as described in FIG. 4B takes place. After this time duration, the heater is turned off to let the semiconductor chip to cool down.

At the completion of step 1105, if there are more semiconductor chips to be mounted (step 1108), repeat step 1104 to 1108. Otherwise, at step 1109, the assembled platform with bonded semiconductor chips is removed from the bonding setup.

It should be appreciated that, although the bonding processes illustrated in flowchart 1100, are generated by a common set of predetermined temperature set points and time durations, the actual temperature profile of each bonding processes can vary somewhat caused by the variations of process, materials, geometries, etc. as described above.

People having ordinary skills in the arts will understand that, in flowchart 1100, the semiconductor chips mounted sequentially are not necessarily of the same type. For example, the first chip is a laser and the second chip is a photodetector.

Figure 12:
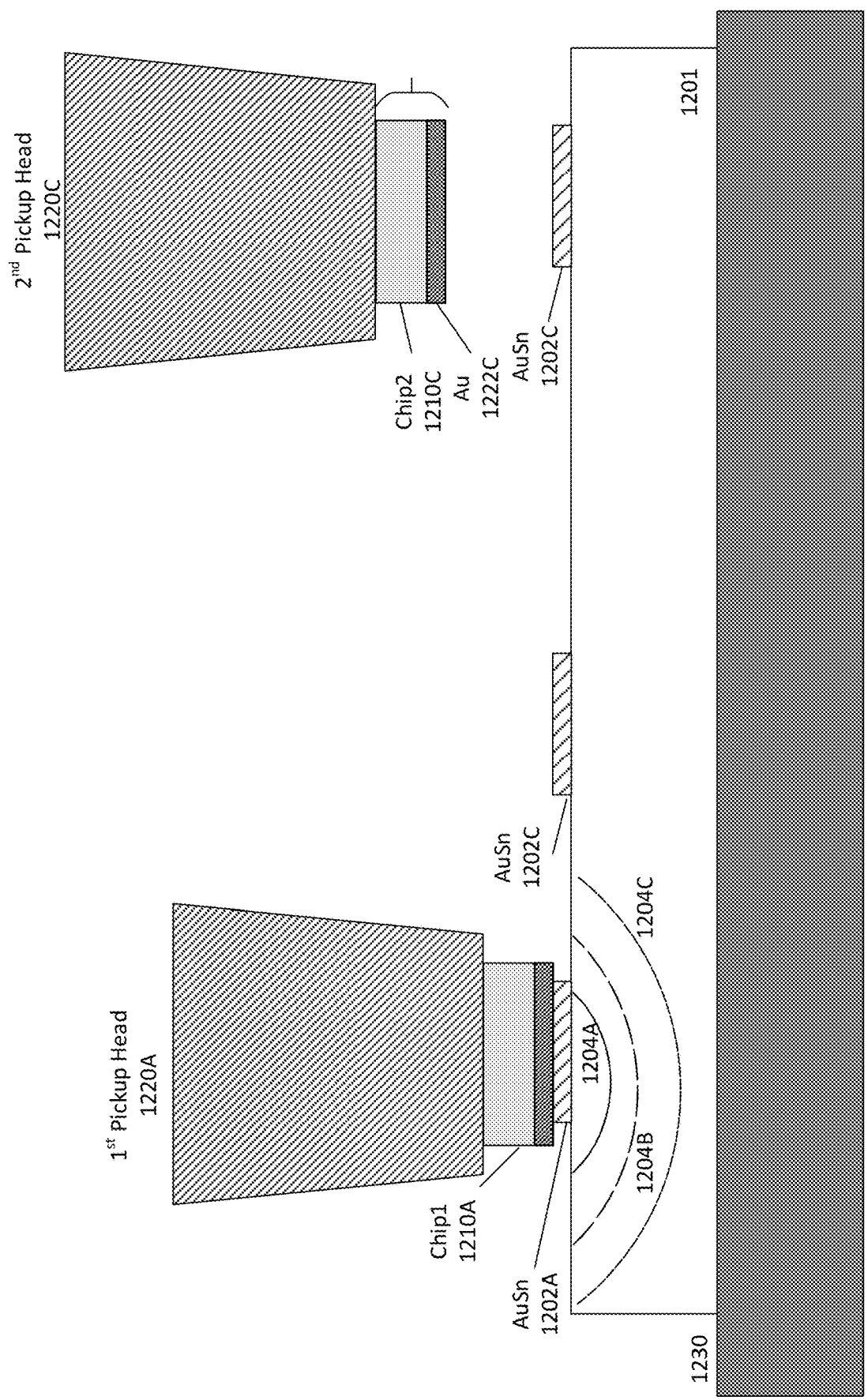
FIG. 12 depicts a laser assembly setup having more than one pickup head, according to some embodiments of the present disclosure.

In FIG. 10 and FIG. 11, a single pickup head is deployed. According to some embodiments, multiple pickup heads can be deployed as shown in FIG. 12. FIG. 12 depicts a mounting process where the heating cycle and the alignment cycle can proceed in parallel. For example, pickup head 1220A in FIG. 12 has aligned Chip1 1210A to its desired location at the AuSn layer 1202A. The heater is turned on to raise the temperature to cause intermixing of the metal layers. During the temperature cycle, pickup head 1220C is performing the alignment process of Chip2 1210C to the desired location at the AuSn layer 1202C. Having this parallel process scheme, the throughput of the system is greatly improved without adding significant cost to the assembly setup.

It should be appreciated that, in the setup of FIG. 12, the semiconductor chips mounted sequentially are not necessarily of the same type. For example, the first chip is a photodetector and the second chip is a laser. The photodetector can be used as a part of active alignment system when aligning the laser. Thus, the dual pickup head system not only improves the throughput of the mounting process, but also enables the active alignment which would not have been possible in a single-pickup head mounting system.

The preceding description sets forth numerous specific details such as examples of specific systems, components, methods, and so forth, to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. A method for performing sequential bonding, said method comprising:
   receiving a substrate having a plurality of receiving pads to a stage, wherein a first and second receiving pads of said plurality of receiving pads each comprise a first metal alloy;
   attaching a first semiconductor chip to said first receiving pad using a first pickup head, said first semiconductor chip comprising a first metal layer;
   raising a temperature of said first semiconductor chip using a first heating unit coupled to said first pickup head according to a first temperature profile to cause intermixing of said first metal layer on said first semiconductor chip and said first metal alloy of said first receiving pad to form a second metal alloy having a higher melting point than said first metal alloy;

attaching a second semiconductor chip to said second receiving pad using a second pickup head, said second semiconductor chip comprising a second metal layer; and raising a temperature of said second semiconductor chip by a second heating unit coupled to said second pickup head according to a second temperature profile to cause intermixing of said second metal layer on said second semiconductor chip and said first metal alloy of said second receiving pad to form a third metal alloy having a higher melting point than said first metal alloy;

wherein said first predetermined temperature profile comprises temperature set points and time durations and is substantially similar to said second predetermined temperature profile.

2. The method of claim 1, wherein said first heating unit is integrated with said first pickup head and said second heating unit is integrated with said second pickup head.

3. The method of claim 1, wherein said first pickup head and said second pickup head are configured to operate independent of each other.

4. The method of claim 1, wherein said first pickup head and said second pickup head are configured to operate with an alternating mode to avoid interference.

5. The method of claim 1, wherein said second pickup head attaches said second semiconductor chip based on a measurement from said first semiconductor chip via said first pickup head.

6. The method of claim 1, wherein said second semiconductor chip comprises a laser and said first semiconductor chip comprises a photo-detector.

7. The method of claim 1, wherein said second semiconductor chip comprises a light emitting diode and said first semiconductor chip comprises a photo-detector.

8. The method of claim 1, wherein said second pickup head attaches said second semiconductor chip based on a measurement on said second semiconductor chip caused by a light signal generated from said first semiconductor chip.

9. The method of claim 1, wherein said second semiconductor chip comprises a photo-detector and said first semiconductor chip comprises a laser.

10. The method of claim 1, wherein said second semiconductor chip comprises an array of photo-detectors and said first semiconductor chip comprises an array of optoelectronic devices.

11. The method of claim 1, wherein said substrate comprises silicon.

12. The method of claim 1, wherein said substrate comprises one or more integrated optical filters.

13. The method of claim 1, wherein said substrate comprises one or more integrated optical combiners.

14. The method of claim 1, wherein said substrate comprises one or more integrated optical couplers.

15. The method of claim 1, wherein said substrate comprises one or more integrated optical waveguides.

16. The method of claim 1, wherein said substrate comprises one or more integrated heaters for local temperature controls during operation.

17. The method of claim 1, wherein said first metal alloy comprises gold, tin, and copper.

18. The method of claim 1, wherein said first metal alloy comprises gold and germanium.

19. The method of claim 1, wherein said first metal alloy comprises platinum and tin.

20. The method of claim 1, wherein said first metal comprises gold.

* * * * *